US008588011B2

United States Patent
Sato

(10) Patent No.: US 8,588,011 B2
(45) Date of Patent: Nov. 19, 2013

(54) SEMICONDUCTOR DEVICE AND METHOD

(75) Inventor: Toshiyuki Sato, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 32 days.

(21) Appl. No.: 13/367,248

(22) Filed: Feb. 6, 2012

(65) Prior Publication Data

US 2012/0206982 A1  Aug. 16, 2012

(30) Foreign Application Priority Data

Feb. 10, 2011 (JP) .................................. 2011-026939

(51) Int. Cl.
*G11C 5/14* (2006.01)

(52) U.S. Cl.
USPC ................................ 365/189.16; 365/189.09

(58) Field of Classification Search
USPC ........................ 365/189.16, 189.09
See application file for complete search history.

(56) References Cited

U.S. PATENT DOCUMENTS

| 6,667,933 | B2 * | 12/2003 | Tomita | 365/233.14 |
| 2001/0055236 | A1 * | 12/2001 | Matsui et al. | 365/230.06 |
| 2002/0001246 | A1 * | 1/2002 | Hidaka | 365/222 |
| 2003/0128614 | A1 * | 7/2003 | Hidaka | 365/222 |
| 2009/0244951 | A1 * | 10/2009 | Murakuki et al. | 365/145 |
| 2009/0303811 | A1 * | 12/2009 | Kim | 365/194 |
| 2010/0220540 | A1 * | 9/2010 | Takita et al. | 365/226 |

FOREIGN PATENT DOCUMENTS

JP   11-185489 A   7/1999

* cited by examiner

*Primary Examiner* — Michael Tran

(74) *Attorney, Agent, or Firm* — McGinn IP Law Group, PLLC

(57) ABSTRACT

A semiconductor device is provided with first and second main word lines, and a control circuit. The control circuit, in response to a command signal received from outside of the semiconductor device, activates the first main word line at a first timing, and activates the second main word line at a second timing different from the first timing, the first main word line maintaining an activation state at said second timing.

14 Claims, 15 Drawing Sheets

FIG. 10

| MS | A2 | A1 | A0 | B7 | B6 | B5 | B4 | B3 | B2 | B1 | B0 |
|---|---|---|---|---|---|---|---|---|---|---|---|
| H | L | L | L | L | L | L | L | L | L | L | H |
| H | L | L | H | L | L | L | L | L | L | H | L |
| H | L | H | L | L | L | L | L | L | H | L | L |
| H | L | H | H | L | L | L | L | H | L | L | L |
| H | H | L | L | L | L | L | H | L | L | L | L |
| H | H | L | H | L | L | H | L | L | L | L | L |
| H | H | H | L | L | H | L | L | L | L | L | L |
| H | H | H | H | H | L | L | L | L | L | L | L |
| L | L | L | L | H | H | H | H | H | H | H | H |
| L | L | L | H | H | H | H | H | H | H | H | H |
| L | L | H | L | H | H | H | H | H | H | H | H |
| L | L | H | H | H | H | H | H | H | H | H | H |
| L | H | L | L | H | H | H | H | H | H | H | H |
| L | H | L | H | H | H | H | H | H | H | H | H |
| L | H | H | L | H | H | H | H | H | H | H | H |
| L | H | H | H | H | H | H | H | H | H | H | H |

SEMICONDUCTOR DEVICE AND METHOD

REFERENCE TO RELATED APPLICATION

This application is based upon and claims the benefit of the priority of Japanese patent application No. 2011-026939, filed on Feb. 10, 2011, the disclosure of which is incorporated herein in its entirety by reference thereto. The present invention relates to a semiconductor device, and in particular, to a semiconductor memory device provided with a plurality of main word lines.

BACKGROUND

In recent years, there has been a remarkable increase in the processing speed of writing data to, and reading data from, semiconductor memory devices.

Patent Document 1 discloses technology for a semiconductor memory device including memory cells connected to a plurality of word lines, where speeding up of data writing and reading is realized by specialization of 2 driver circuits in which a plurality of word lines can be controlled, with regard to respective writing and reading operations.
[Patent Document 1]
Japanese Patent Kokai Publication No. JP-H11-185489A

SUMMARY

The entire disclosure of Patent Document 1 is incorporated herein by reference thereto. The following analysis is given from a viewpoint of the present invention.

A semiconductor memory device disclosed in Patent Document 1 includes a plurality of main word lines, but in normal operation, only one main word line is activated, and read operations and write operations are realized by selecting a memory cell connected to this activated main word line.

Meanwhile, with regard to operation modes of the semiconductor memory device, there is a normal operation mode where write and read operations are performed with respect to a memory cell, and an operation mode for test and inspection when manufacturing the semiconductor memory device. For example, in a mass production process of the semiconductor memory device, there is a P/W process to perform a characteristic check on a wafer, and a test called a burn-in process in which the semiconductor memory device is operated at high temperature and high voltage for a prescribed time to detect a product that is defective at an initial stage. In these types of test processes, semiconductor memory devices are tested in large quantities at the same time. Furthermore, an inspection for each test process should be performed quickly.

As a result, a test mode is desired whereby a plurality of main word lines are activated simultaneously and data is written simultaneously to a plurality of memory cells. This is because activating the plurality of main word lines simultaneously and writing test data all together to the memory cells gives a shorter test time than activating one main word line and writing data to a memory cell.

However, in the normal operation mode of the semiconductor memory device as described above, a configuration is used in which there is no necessity to activate a plurality of main word lines, and in which a driver that drives a main word line is provided with sufficient power to drive one main word line. This is not surprising if cost is considered. That is, if a driver is used that can drive a plurality of main word lines, the driver circuit size becomes large, and the circuit size of the semiconductor memory device itself also becomes large. Furthermore, since electric power consumed by the driver is also larger, enhancement of a power supply circuit and the like is also necessary.

As described above, with a driver having power capable of driving one main word line, a plurality of main word lines cannot be activated, and it is not possible to satisfy the desire to activate a plurality of main word lines simultaneously, as desired in the test process.

As described above, with the conventional technology there are problems to be solved.

In one aspect of the present invention, with regard to a semiconductor device provided with a plurality of main word lines, the semiconductor device is desired to have the plurality of main word lines activated simultaneously.

According to a first aspect of the present invention, there is provided a semiconductor device having first and second main word lines, and a control circuit.

The control circuit, in response to a command signal received from outside of the semiconductor device, activates the first main word line at a first timing, and activates the second main word line at a second timing different from the first timing, said first main word line maintaining an activation state at said second timing.

According to a second aspect of the present invention, there is provided a method. The method includes rendering a plurality of word lines active states one after another, maintaining the active state of the word lines so that a plurality of memory cells provided correspondingly to the word lines are accessible, and writing data to each of the memory cells.

The meritorious effects of the present invention are included as follows, without limitation hereto. According to each aspect of the present invention, with regard to a semiconductor device provided with a plurality of main word lines, the plurality of main word lines are activated simultaneously.

BRIEF DESCRIPTION OF THE DRAWINGS

FIG. 10 is a truth table showing input output relationships of the address decoder shown in FIG. 6;

PREFERRED MODES

Figure 1:
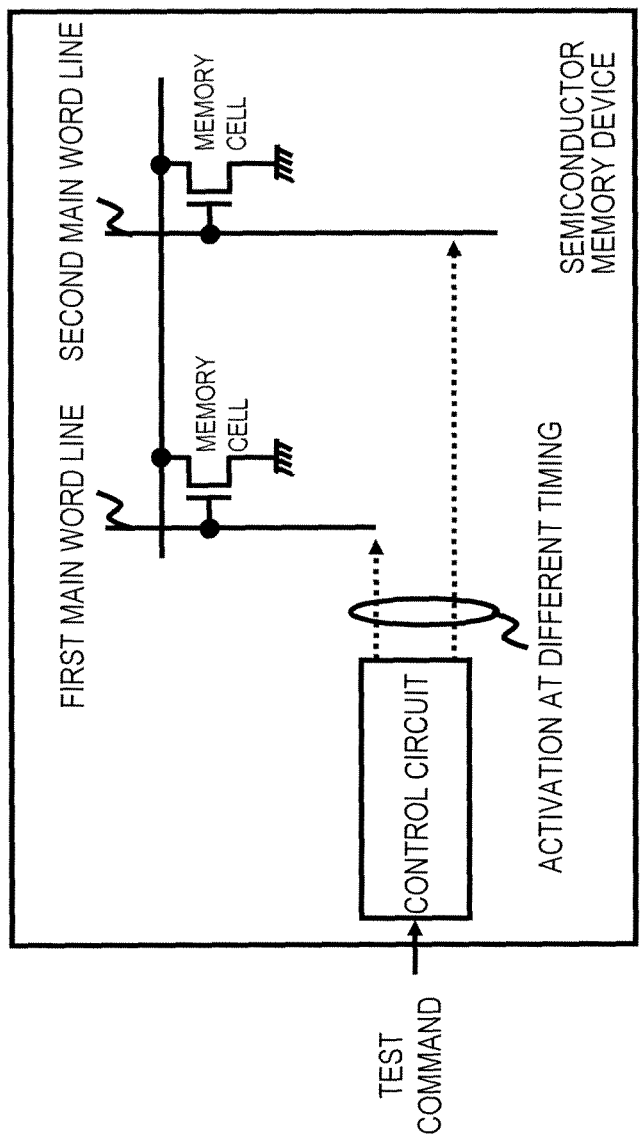
FIG. 1 is a diagram for describing an outline of an exemplary embodiment of the present invention.

Following modes are mentioned below by way of preferred modes.

[First Mode]

A semiconductor memory device, as mentioned in the first aspect above.

[Second Mode]

The semiconductor device, wherein the control circuit, in a case of receiving an additional command signal received from outside of the semiconductor device, may activate either one of the first and the second main word lines.

[Third Mode]

The semiconductor device may, further comprise first and second sub word lines provided correspondingly to the first and second main word lines, respectively; and a sub word driver that substantially simultaneously activates the first and second sub word lines after the second timing.

[Fourth Mode]

The semiconductor device may, further comprise:

a first main word line driver that is connected to the first main word line, and a second main word line driver that is connected to the second main word line; wherein the control circuit may output first and second selection signals to the first and second main word line drivers in response to the command signal, respectively, the second selection signal being outputted after the first selection signal is outputted, and the first and second main word line drivers respectively activating the first and second main word lines in response to the first and second selection signals.

[Fifth Mode]

The semiconductor device, wherein the command signal may be a test command signal, and the additional command signal may be an active command signal.

[Sixth Mode]

The semiconductor device, wherein the control circuit further may output first and second control signals that controls activation and inactivation of the first and second main word line drivers, to the first and the second main word line drivers commonly.

[Seventh Mode]

The semiconductor device, wherein the control circuit may comprise:

an operation mode control circuit that outputs the first control signal and the second control signal from an internal command in response to a command issued from the outside;

an address decoder that outputs the first selection signal and the second selection signal in accordance with an internal address signal in response to an address signal issued from the outside; and a multi-mode selector that outputs a mode selection signal to the address decoder in response to the command signal;

wherein said address decoder may output both of the first and second selection signals in spite of the internal address signal when the address decoder received the mode selection signal.

[Eighth Mode]

The semiconductor device, wherein said control circuit further may comprise a first delay circuit that delays the first selection signal, and a second delay circuit that delays the second selection signal.

[Ninth Mode]

The semiconductor device, wherein a delay amount of the first delay circuit and a delay amount of the second delay circuit may be different from each other.

[Tenth Mode]

The semiconductor device may comprise:

a plurality of memory cells;

a plurality of word lines provided correspondingly to the memory cells, respectively; and a control circuit rendering the word lines active states one after another, maintaining the active states of the word lines and writing data to each of the memory cells.

[Eleventh Mode]

The semiconductor device, further may comprise a plurality of word line drivers provided correspondingly to the word lines, respectively, wherein the control circuit may output a plurality of selection signals one after another to the word line drivers, respectively, so that each of the word line drivers activates a corresponding one of the word lines in response to a corresponding one of the selection signals.

[Twelfth Mode]

The semiconductor device, wherein the control circuit may include a plurality of delay circuits, and the selection signals being outputted through the delay circuits, respectively.

[Thirteenth Mode]

The semiconductor device, wherein the delay circuits may have delay amounts, respectively, and the delay amounts of the delay circuits being different from one another.

[Fourteenth Mode]

A method, as mentioned in the second aspect above.

[Fifteenth Mode]

The method, further may comprise rendering a plurality of sub word lines active states substantially simultaneously, the sub word lines being provided correspondingly to the word lines; and maintaining the active states of the sub word lines.

Next, a description is given of an outline of an exemplary embodiment using FIG. 1. It is to be noted that reference symbols in the drawings appended to this outline are added for convenience to respective elements as an example in order to assist understanding, and are not intended to limit the present invention to modes shown in the drawings.

As described above, in a semiconductor memory device provided with a plurality of main word lines, it is desired to activate the plurality of main word lines simultaneously. For example, among modes where the plurality of main word lines are activated simultaneously, there is a test mode (referred to below as a multi ode) of the semiconductor memory device. In general, in a normal operation mode of the semiconductor memory device, there is no necessity to activate a plurality of main word lines, and based on a consideration of cost, a configuration is used where a driver driving a main word line is provided with sufficient power to drive one main word line. As a result, with a driver having power capable of driving one main word line, a plurality of main word lines cannot be activated, so that it is not possible to activate a plurality of main word lines simultaneously, as desired in a test process. Therefore, a semiconductor memory device is desired that activates a plurality of main word lines, without increasing the power of the driver that drives a main word line.

Accordingly, the semiconductor memory device shown in FIG. 1 is provided. The semiconductor memory device shown in FIG. 1 is provided with first and second main word lines, and a control circuit which, in response to a test command received from outside, activates the first main word line at a first timing, and activates the second main word line at a second timing different from the first timing, while maintaining an activation state of the first main word line.

When a test command is issued to the semiconductor memory device shown in FIG. 1 and operation is performed in a multi ode, it is possible to shift timing at which the first main word line and the second main word line are activated. As a result, since it is not necessary to activate the first main word line and the second main word line simultaneously, even with a driver having power to drive only one main word line, there is no lack of power. Therefore, the semiconductor memory device does not malfunction due to a lack of driver power. Furthermore, since there is no need to use a driver with higher power, there is no increase in power consumption in the semiconductor memory device.

First Exemplary Embodiment

Next, a more detailed description is given concerning a first exemplary embodiment of the present invention, using the drawings. In the following description, a semiconductor memory device is a DRAM (Dynamic Random Access Memory). However, the semiconductor memory device is not limited to a DRAM, and the same applies to semiconductor memory devices outside of a DRAM, such as a SRAM (Static Random Access Memory), PRAM (Phase-change Random Access Memory), flash memory, and the like.

Figure 2:
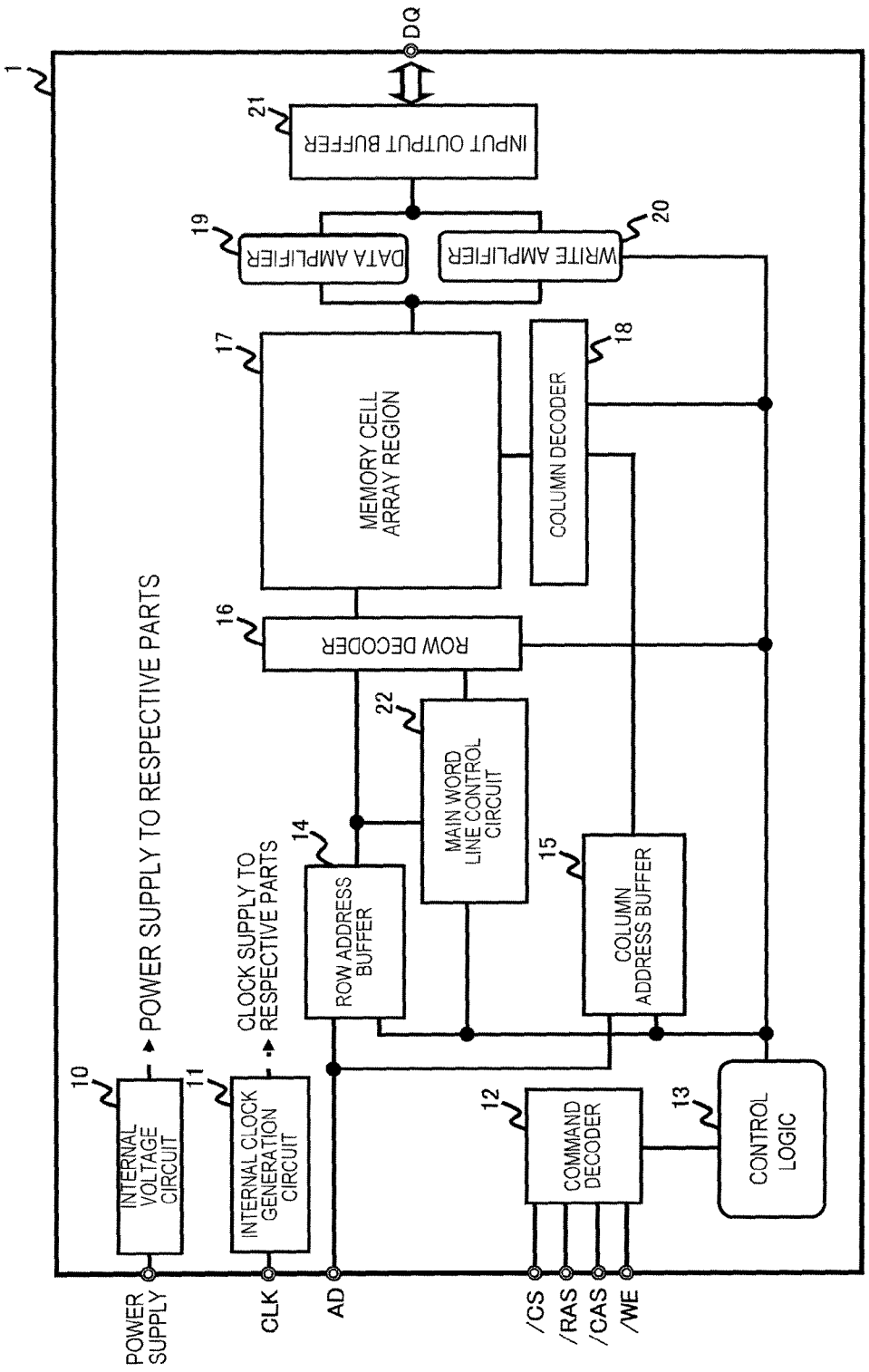
FIG. 2 is a diagram showing an example of an overall configuration of a semiconductor memory device of a first exemplary embodiment of the present invention.

FIG. 2 is a block diagram showing an example of an overall configuration of the semiconductor memory device 1 according to the present exemplary embodiment. The semiconductor memory device 1 shown in FIG. 2 is provided with external terminals such as command terminals (/CS, /RAS, /CAS, /WE), an address terminal (AD), a power supply terminal, a clock terminal (CLK), a data terminal (DQ), and the like.

The semiconductor memory device 1 shown in FIG. 2 is configured from an internal voltage circuit 10, an internal clock generation circuit 11, a command decoder 12, a control logic 13, a row address buffer 14, a column address buffer 15, a row decoder 16, a memory cell array region 17, a column decoder 18, a data amplifier 19, a write amplifier 20, an input output buffer 21, and a main word line control circuit 22.

A power supply and clock used in the semiconductor memory device 1 are generated and supplied by the internal voltage circuit 10 and the internal clock generation circuit 11.

A command signal to the semiconductor memory device 1 is received by command terminals. Specifically, a command signal formed of a chip select signal /CS, a row address strobe signal /RAS, a column address strobe signal /CAS, a write enable signal /WE, and the like, is received. The command signal formed by these signals is decoded by the command decoder 12, and a decoding result is outputted to the control logic 13.

In the control logic 13, an internal command is generated based on a decoding result by the command decoder 12, and is outputted to respective circuit blocks, which are: the row address buffer 14, the column address buffer 15, the row decoder 16, the main word line control circuit 22, the column decoder 18, and the write amplifier 20.

The address terminal receives an address signal AD issued from outside. The address signal AD received from the address terminal is supplied to the row address buffer 14 and the column address buffer 15.

In the control logic 13, in a case where the command signal received from the command decoder 12 is an active command (ACT) that activates a main word line corresponding to a row address, or a command related to a row address such as a test command that transitions the semiconductor memory device 1 to a multi-mode, the row address buffer 14 is selected. On the other hand, in a case where the command signal is a command related to a column address such as a read command (READ) or a write command (WRITE), the column address buffer 15 is selected.

The row address taken into the row address buffer 14 is supplied to the row decoder 16.

The row decoder 16 decodes the row address and outputs a decoding result to the memory cell array region 17. Meanwhile, the column address taken into the column address buffer 15 is supplied to the column decoder 18.

The column decoder 18 decodes a column address and supplies a decoding result to the memory cell array region 17.

The memory cell array region 17 is a circuit block including a plurality of memory cells and a plurality of sense amplifiers. Selection of a memory cell included in the memory cell array region 17 is performed by the row decoder 16 and the column decoder 18.

When a data read operation is performed, read data that has been read from a selected memory cell is amplified by a corresponding sense amplifier, and is outputted from the memory cell array region 17. Thereafter, further amplification is performed by the data amplifier 19, and then data is outputted from a data terminal via the input output buffer 21. When a data write operation is performed, write data inputted to a data terminal is written to a selected memory cell, via the input output buffer 21 and the write amplifier 20.

The main word line control circuit 22 is a circuit that receives an internal address signal outputted from the row address buffer 14, and an internal command signal outputted from the control logic 13, and controls a main word line. The main word line control circuit 22 corresponds to the control circuit of FIG. 1.

Figure 3:
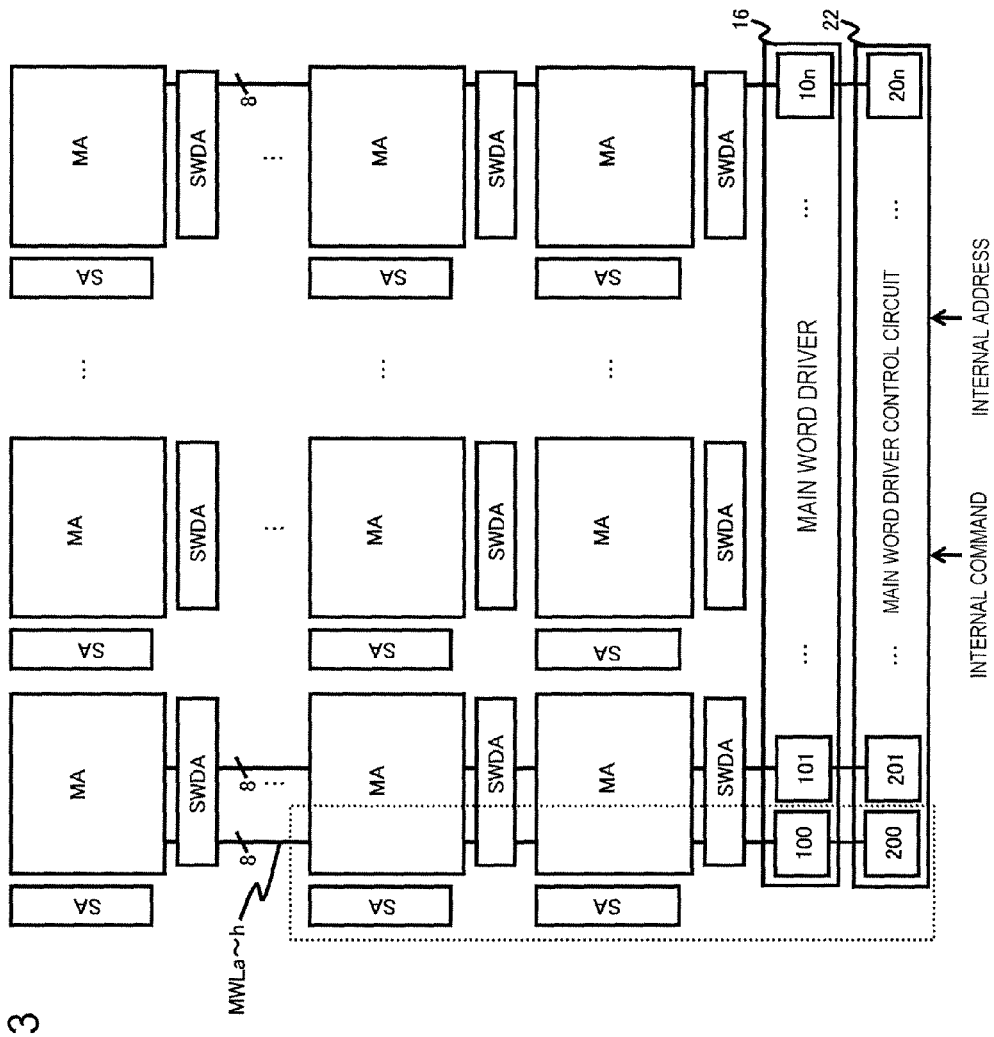
FIG. 3 is a diagram showing a relationship between an internal configuration of a memory cell array region of FIG. 2 and drivers connected to respective memory cell arrays.

A detailed description is given below concerning the main word line control circuit 22. FIG. 3 is a diagram showing a relationship between an internal configuration of the memory cell array region 17 of FIG. 2 and drivers connected to the respective memory cell arrays MA.

Figure 4:
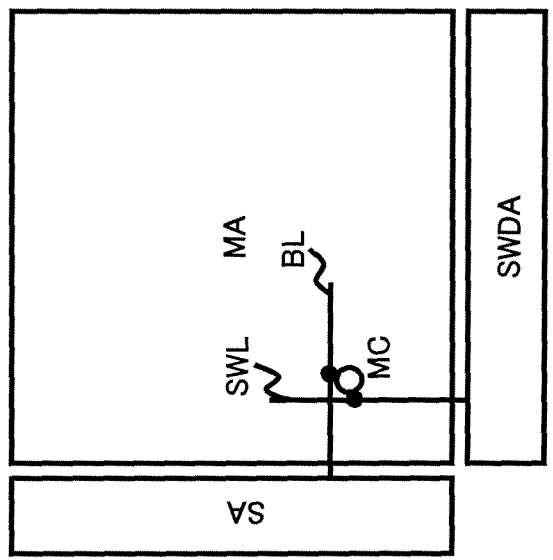
FIG. 4 is a diagram showing an example of an internal configuration of a memory cell array of FIG. 3.

As shown in FIG. 3, a plurality of memory cell arrays MA, sense amplifiers SA corresponding to the plurality of memory cell arrays, and sub word driver arrays SWDA are provided. A memory cell array MA has a plurality of sub word lines SWL and a plurality of hit lines BL, and a memory cell MC is provided at an intersection point of each sub word line SWL and bit line BL (refer to FIG. 4).

The row decoder 16 includes main word drivers 100 to 10n (n is an integer greater than or equal to 1; this also applies below). Each main word driver can respectively activate a plurality of main word lines, and the main word drivers 100 to 10n shown in FIG. 3 each perform activation of 8 main word lines. For example, the main word driver 100 of FIG. 3 drives the 8 main word lines of: main word line MWLa to MWLh. Respective main word lines MWL are fed to the corresponding sub word driver arrays SWDA.

The respective main word drivers are controlled by the main word line control circuit 22. The main word line control circuit 22 is formed of main word driver control circuits 200 to 20n. Details of the main d driver control circuits 200 to 20n are described later. The main word driver control circuits 200 to 20n are provided in correspondence with the main word drivers 100 to 10n.

Figure 5:
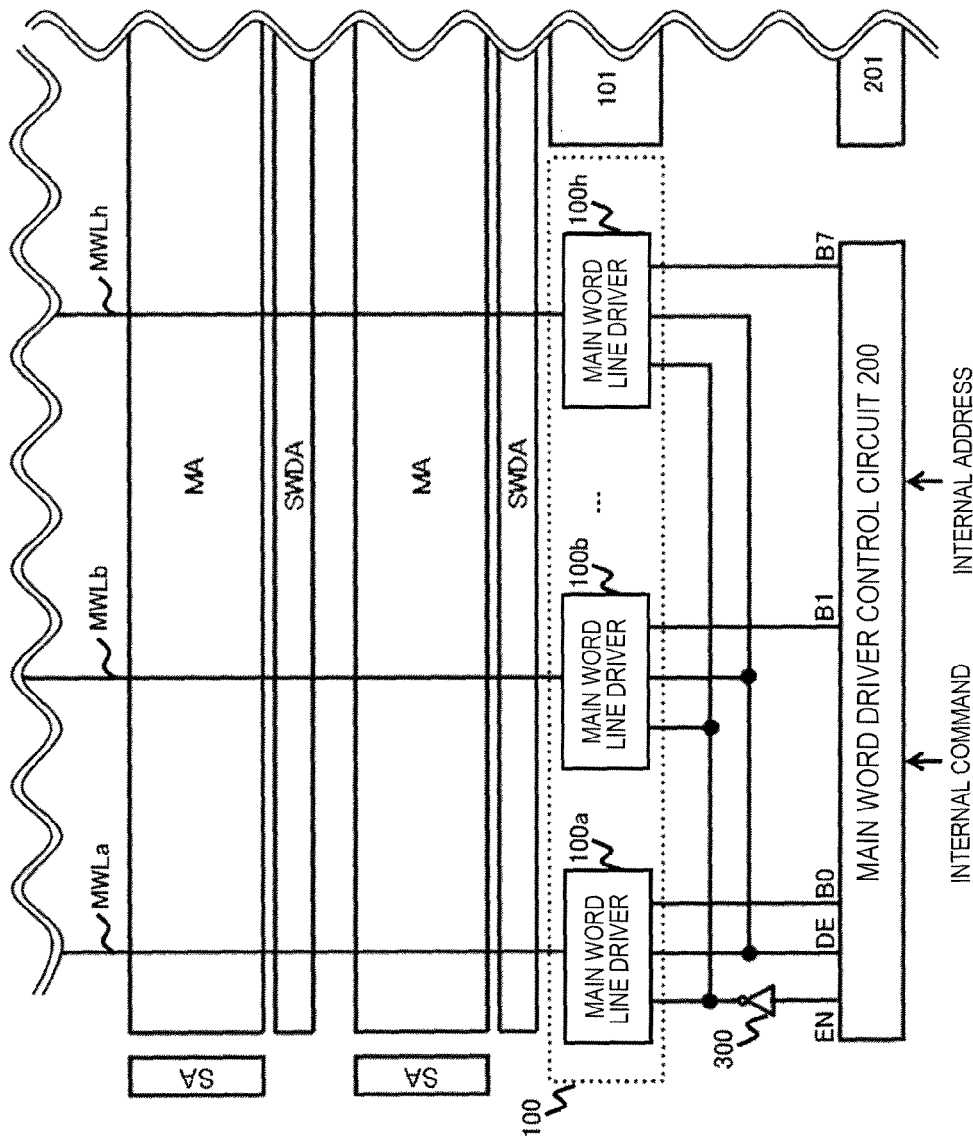
FIG. 5 is an enlarged view of a dashed line portion of FIG. 3.

Next, a description is given concerning connections between the main word drivers 100 to 10n and the main word line control circuit. FIG. 5 is an enlarged view of a dashed line portion of FIG. 3. Using FIG. 5, a specific description is given concerning a relationship between the main word driver 100 and the main word driver control circuit 200.

The main word driver 100 activates the 8 main word lines (MWLa to MWLh). The main word driver 100 includes main word line drivers 100a to 100h respectively corresponding to the 8 main word lines. The respective main word line drivers activate the corresponding main word lines MWLa to MWLh. The plurality of main word line drivers are controlled by a common driver 300. The main word driver control circuit 200 corresponding to the main word driver 100 controls the 8 main word line drivers 100a to 100h. That is, the main word driver control circuit 200 performs control of the 8 main word lines. It is to be noted that a description is given where there are 8 main word drivers, but the number of main word drivers is not limited to 8 (the main word lines driven by the respective main word drivers is not limited to 8).

The main word driver control circuit 200 receives an internal command and an internal address, and outputs a control signal in order to control the main word line drivers. The main word driver control circuit 200 outputs a control signal DE, a control signal EN, and selection signals B0 to B7.

The control signal DE controls disabling of operations of each the main word line drivers. The control signal EN controls enabling of operations of each of the main word line drivers. The control signal DE and the control signal EN are commonly outputted to the main word line drivers 100a to 100h. The selection signals B0 to B7 are signals for selecting respective main word lines. The respective main word driver control circuits control timing of activation with respect to corresponding main word lines, by outputting the respective selection signal B0 to B7 at different timings.

Figure 6:
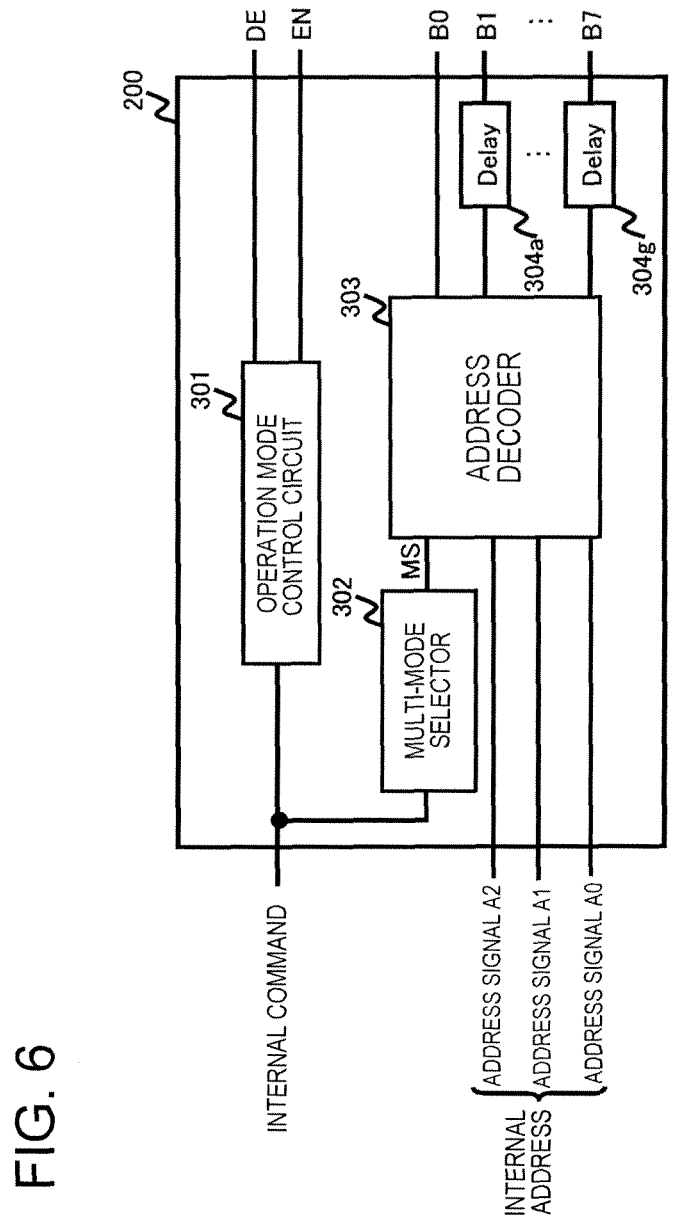
FIG. 6 is a diagram showing an example of an internal configuration of a main word driver control circuit shown in FIG. 5.

Next, a detailed description of the main word driver control circuits 200 to 20n is given. Since the main word driver control circuits 200 to 20n all have an identical configuration, the description is limited to the main word driver control circuit 200. FIG. 6 is a diagram showing an example of an internal configuration of the main word driver control circuit 200.

As shown in FIG. 6, the main word driver control circuit 200 is configured from an operation mode control circuit 301, a multi-mode selector 302, an address decoder 303, and delay circuits 304a to 304g. As described above, the main word driver control circuit 200 receives an internal command and an internal address, and outputs respective control signals (the control signal DE, the control signal EN, and the selection signals B0 to B7).

Figure 7:
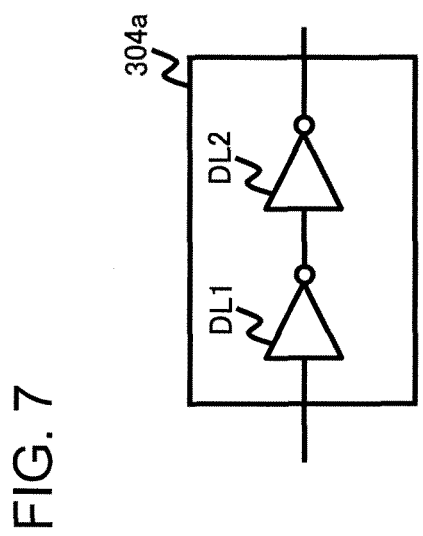
FIG. 7 is a diagram showing an example of an internal configuration of a delay circuit shown in FIG. 6.
Figure 8:
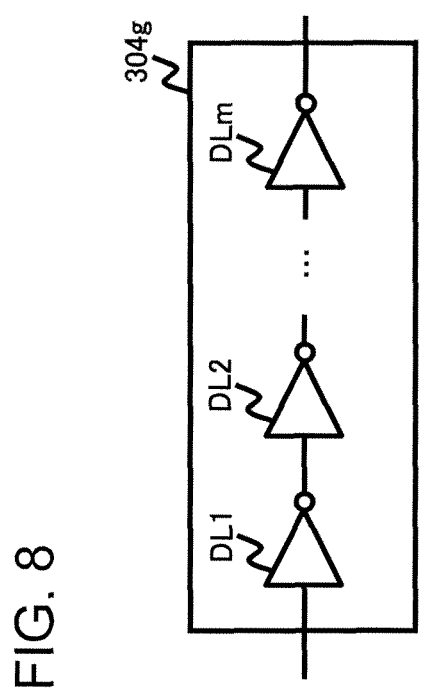
FIG. 8 is a diagram showing an example of an internal configuration of another delay circuit shown in FIG. 6.

The control signals DE and EN are outputted from the operation mode control circuit 301 that has received the internal command. The selection signals B0 to B7 are signals outputted from the address decoder 303 that has received internal address signals A2 to A0, and each is outputted at different timing. As a result, the selection signals B1 to B7 are outputted via the delay circuits 304a to 304g, which have different delay amounts. FIG. 7 is a diagram showing an example of an internal configuration of the delay circuit 304a. FIG. 8 is a diagram showing an example of an internal configuration of the delay circuit 304g. In this way, in the respective the delay circuits, a plurality of delay elements (DL1 to DLm) are used to set different delay amounts (m is an integer greater than or equal to 1; the same applies below). It is to be noted that in the description of the present exemplary embodiment, delay circuits respectively corresponding to the selection signals B1 to B7 are provided, but there is no limitation thereto. For example, delay circuits with the same delay amounts may be provided to 2 selection signals, in accordance with the power of a driver driving a main word line.

In a normal operation mode of the semiconductor memory device 1, only one of the selection signals B0 to B7 is selected. However, in a multi-mode, all selection signals, B0 to B7, outputted from the address decoder 303 are selected, based on a multi-mode selector signal MS outputted from the multi-mode selector 302.

Figure 9:
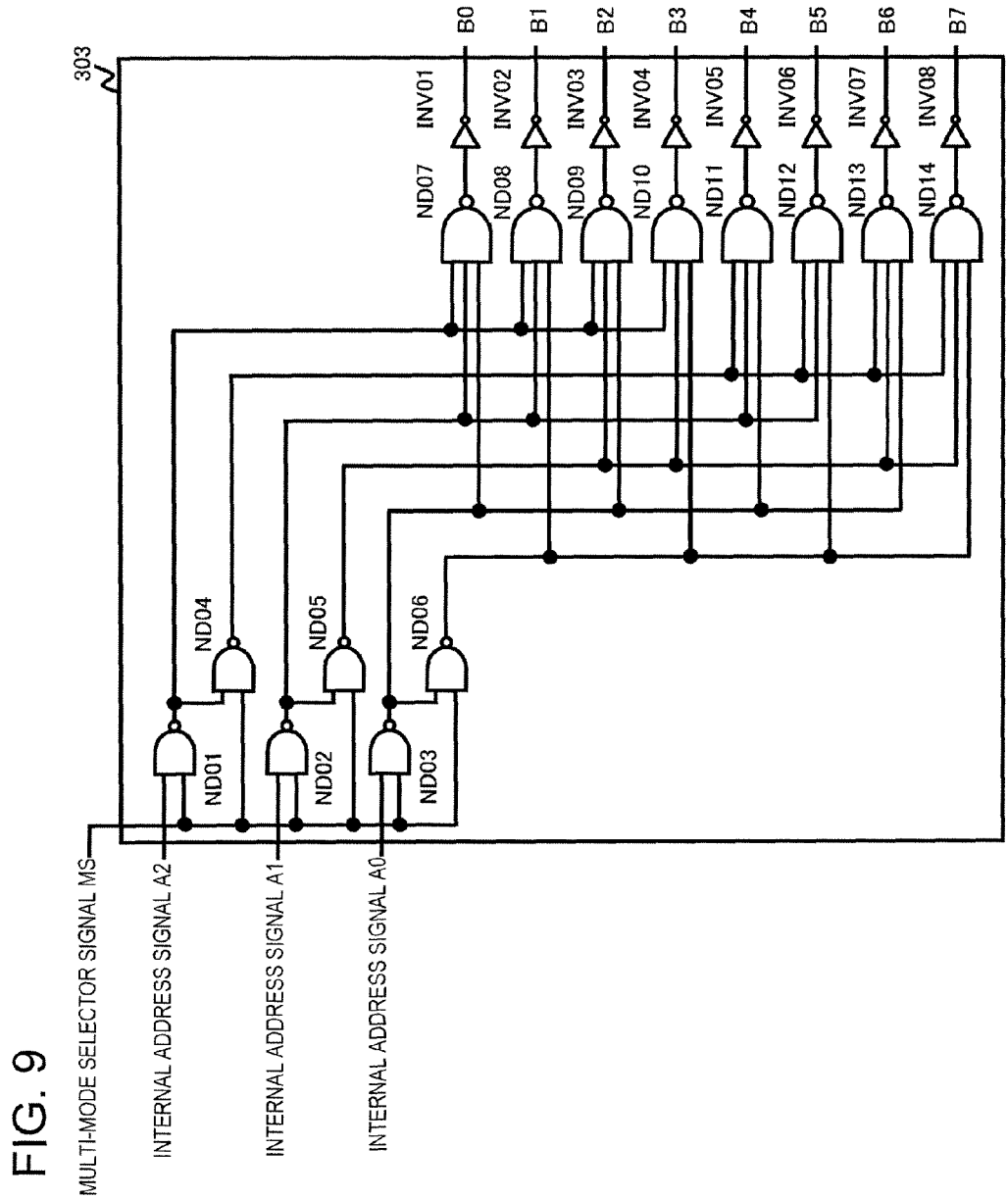
FIG. 9 is a diagram showing an example of an internal configuration of an address decoder shown in FIG. 6.

Next, a description is given concerning the address decoder 303. FIG. 9 is a diagram showing an example of an internal configuration of an address decoder 303. The address decoder 303 receives internal address signals A2 to A0 and the multi-mode selector signal MS, and outputs (decodes) the selection signals B0 to B7. The address decoder 303 is configured from NAND circuits ND01 to ND14 and inverters INV01 to INV08.

In the normal operation mode of the semiconductor memory device 1, the multi-mode selector signal MS is non-active (H level), and only one of the selection signals B0 to B7 is selected in accordance with the internal address signals A2 to A0. On the other hand, in the multi-mode where it is necessary to activate a plurality of main word lines, the multi-mode selector MS signal is activated (L level). In response to the multi-mode selector MS signal being activated, all of the selection signals B0 to B7 are selected (all have an H level). FIG. 10 is a truth table showing input output relationships of the address decoder 303. From FIG. 10, it is understood that if the multi-mode selector signal MS is at an L level, the selection signals B7 to B0 are all at an H level, irrespective of the internal address signals A2 to A0.

Next, a description is given concerning the main word driver circuit 100. As described above, the main word driver circuit 100 is configured from the main word line drivers 100a to 100h. Since each of the main word line drivers has an identical configuration, a description is given taking the main word line driver 100a as an example.

Figure 11:
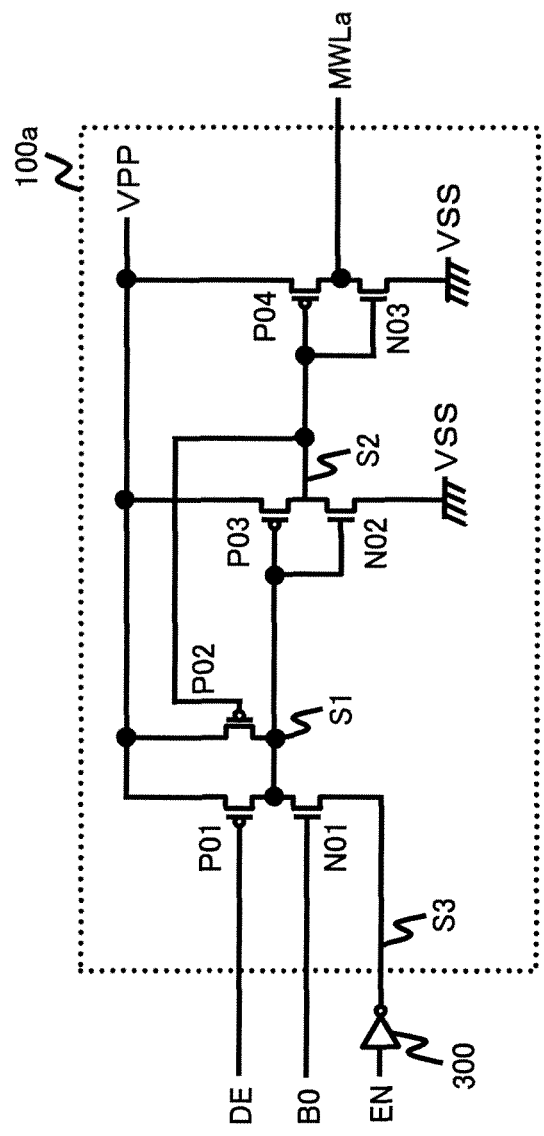
FIG. 11 is a diagram showing an example of an internal configuration of a main word line driver shown in FIG. 3.

FIG. 11 is a diagram showing an example of an internal configuration of the main word line driver 100a. The main word line driver 100a is a circuit that receives a control signal DE, a control signal EN, and a selection signal B0, and activates the main word line MWLa. The main word line driver 100a is configured from P-channel MOS transistors P01 to P04, and N-channel MOS transistors N01 to N03. Two inverters are configured by the P-channel MOS transistors P03 and P04 and the N-channel MOS transistors N02 and N03. It is to be noted that a connection point of drains of the P-channel MOS transistor P01 and the N-channel MOS transistor N01 is node S1; a connection point of drains of the P-channel MOS transistor P03 and the N-channel MOS transistor N02 is node S2; and output of a common driver 300 is node S3.

In the main word driver control circuit 200, when the control signal EN is at an H level, the node S3 is set to an L level, and a source of the N-channel MOS transistor N01 is grounded by the common driver 300. In a state where the source of the N-channel MOS transistor N01 is grounded, when the control signal DE and the selection signal B0 are set to an H level, the node S1 is set to an L level. Thereupon, the node S2 is set to an H level by the inverter configured by the P-channel MOS transistor P03 and the N-channel MOS transistor N02. As a result, the P-channel MOS transistor P02 is in an OFF state, the node S1 is maintained at an L level, and the main word line MWLa is activated to an L level by the inverter configured by the P-channel MOS transistor P04 and the N-channel MOS transistor N03.

As described above, in the multi-mode, since timings at which the selection signals B0 to B7 are selected are each different, the activation timings of the main word lines MWLa to MWLh corresponding to the selection signals B0 to B7 are also different. As a result, there is no necessity for the driver 300, which is commonly connected to the main word line drivers 100a to 100h, to drive 8 main word line drivers simultaneously (the node S1 set to an L level). Accordingly, in a multi-mode also, it is possible to normally activate a plurality of main word lines.

Next, a description is given concerning a sub word driver array SWDA. A sub word driver is a driver for driving a sub word line obtained by dividing main word lines in order to reduce load capacitance of the main word lines. Each sub word driver independently drives respective memory cells. These sub word drivers collectively form the sub word driver array SWDA.

Figure 12:
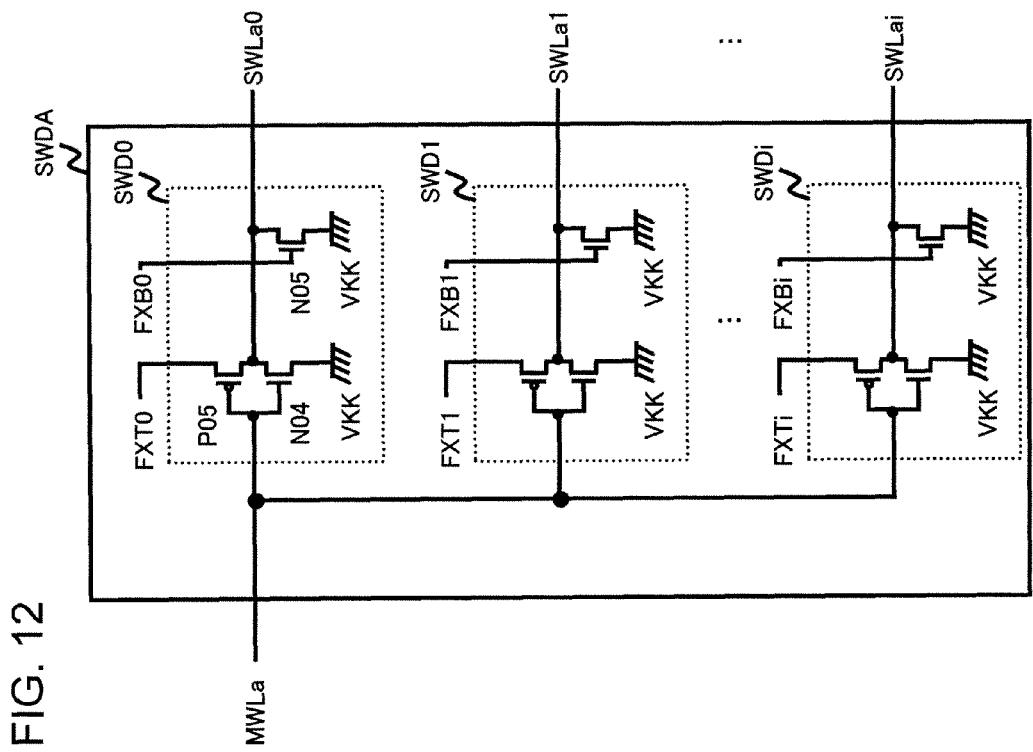
FIG. 12 is a diagram showing an example of an internal configuration of a sub word driver array shown in FIG. 3.

The main word line MWLa is divided into a plurality of sub word lines. FIG. 12 is a diagram showing an example of an internal configuration of the sub word driver array SWDA. The sub word driver array SWDA shown in FIG. 12 is formed from sub word drivers SWD0 to SWDi is an integer greater than or equal to 1) that drive respective sub word lines.

Each sub word driver is configured by 2 N-channel MOS transistors and 1 P-channel MOS transistor. For example, the sub word driver SWD0 is configured from N-channel MOS transistors N04 and N05, and a P-channel MOS transistor P05. Gates of the N-channel MOS transistor N04 and the P-channel MOS transistor P05 are connected to the main word line MWLa, and drains are connected to a sub word line SWLa0. Furthermore, a sub word driver selection line FXT0 is connected to a drain of the P-channel MOS transistor P05. A sub word control line FXB0 is connected to a gate of the N-channel MOS transistor N05. In addition, a negative voltage VKK is connected to sources of the N-channel MOS transistors N04 and N05. Here, the negative voltage VKK is a voltage that is lower than ground voltage. In the sub word driver array SWDA, activation of any of the sub word lines SWLa0 to SWLai, obtained by dividing the main word line MWLa, is performed. When a sub word line connected to a main word line is activated, data is written to a memory cell connected to the sub word line. It is to be noted that the sub word driver array SWDA corresponds to the respective main word lines. Furthermore, sub word driver selection lines FXT0 to FXTi and sub word control lines FXB0 to FXBi are commonly connected to other sub word arrays SWDA.

Next, a description is given concerning operation of the semiconductor memory device 1. First a description is given concerning operation in a normal operation mode.

Figure 13:
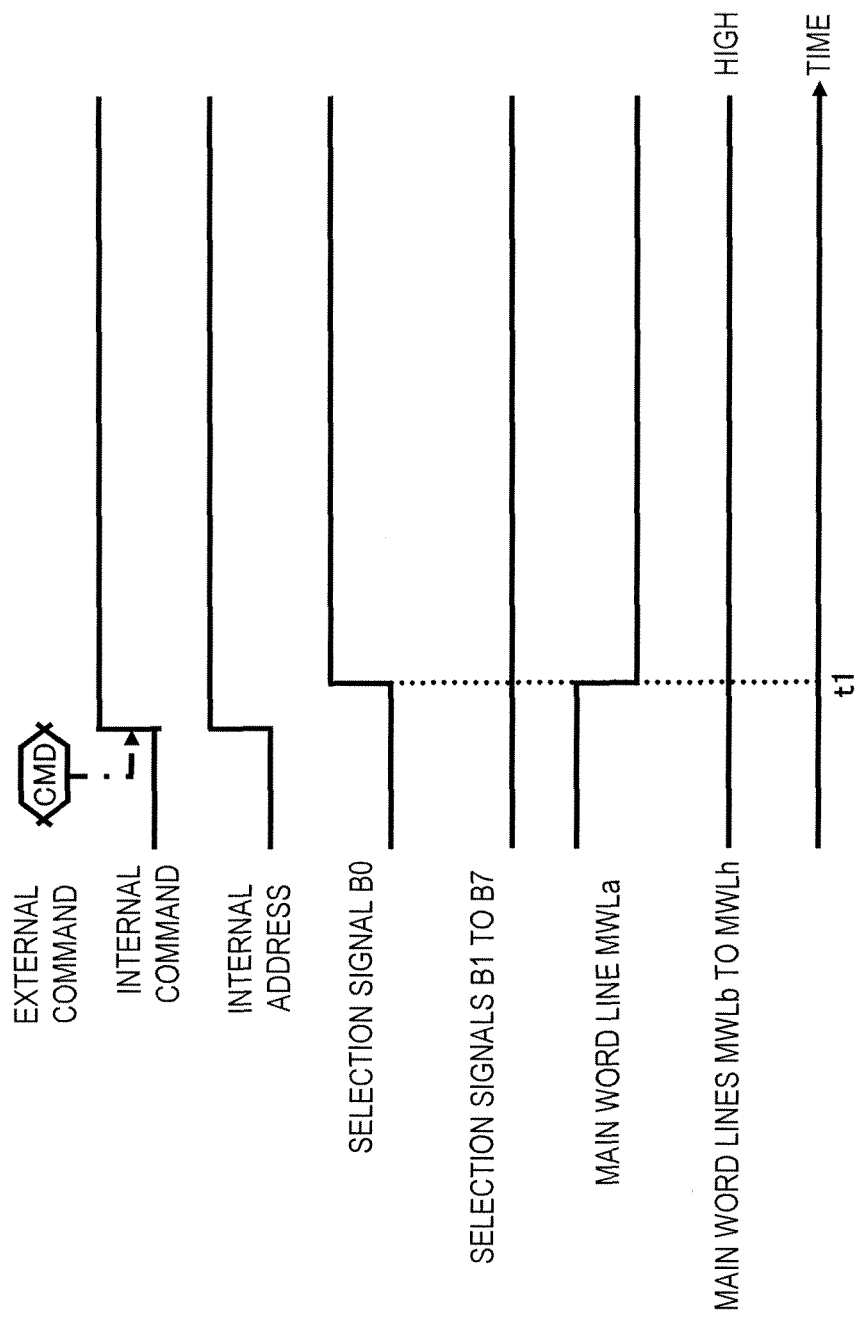
FIG. 13 is a timing chart showing a state of respective signals in a case where a main word line MWLa is activated, when in a normal operation mode.
Figure 14:
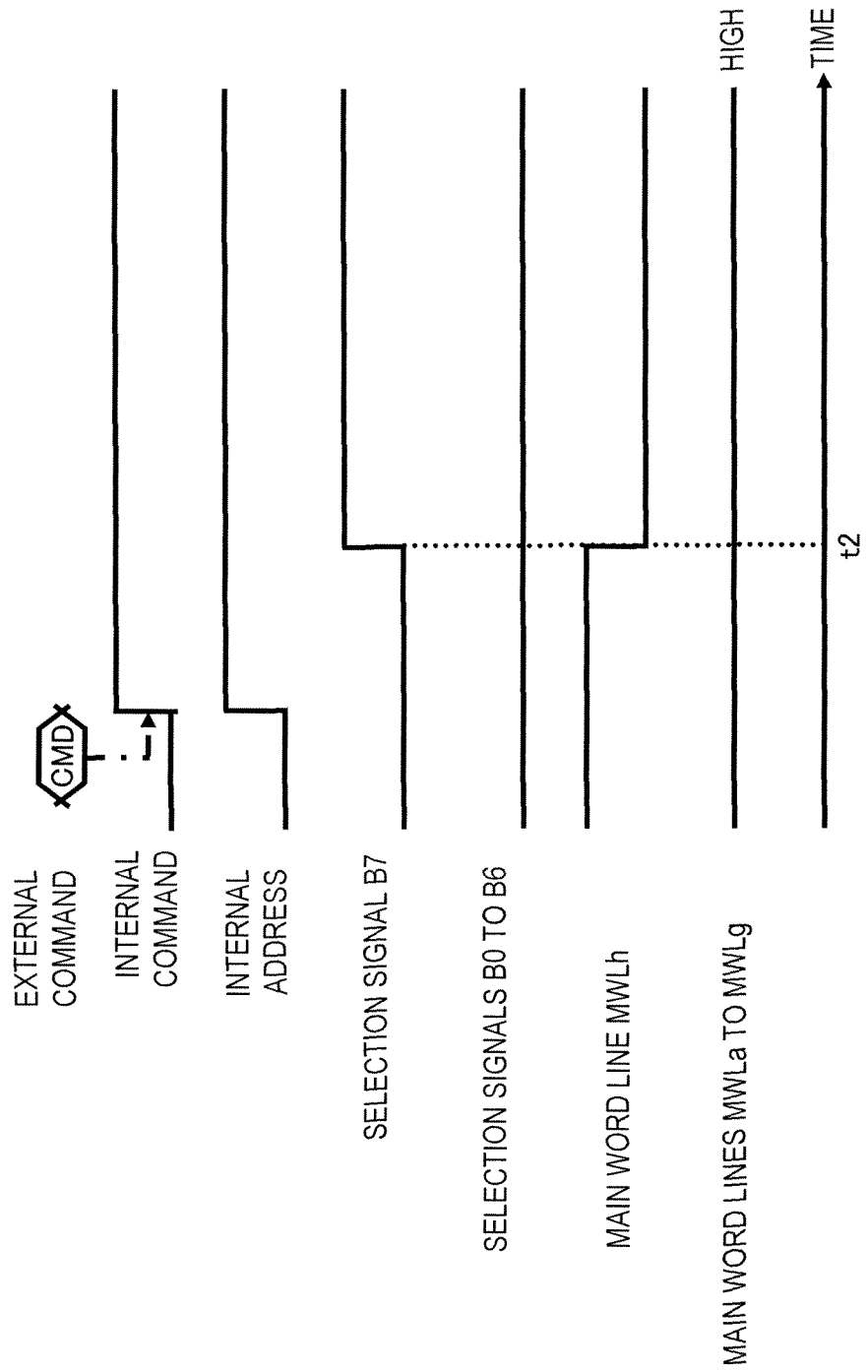
FIG. 14 is a timing chart showing a state of respective signals in a case where a main word line MWLh is activated, when in a normal operation mode.

FIG. 13 is a timing chart showing a state of respective signals in a case where the main word line MWLa is activated. FIG. 14 is a timing chart showing a state of respective signals in a case where the main word line MWLh is activated. In waveforms shown in FIG. 13 and FIG. 14, the selection signal B0 or B7 is selected in accordance with an ACT command issued from outside. That is, in accordance with the ACT command, only one among a plurality of main word lines is activated, and other main word lines are not activated (time t1 in FIG. 13 and time t2 in FIG. 14).

Figure 15:
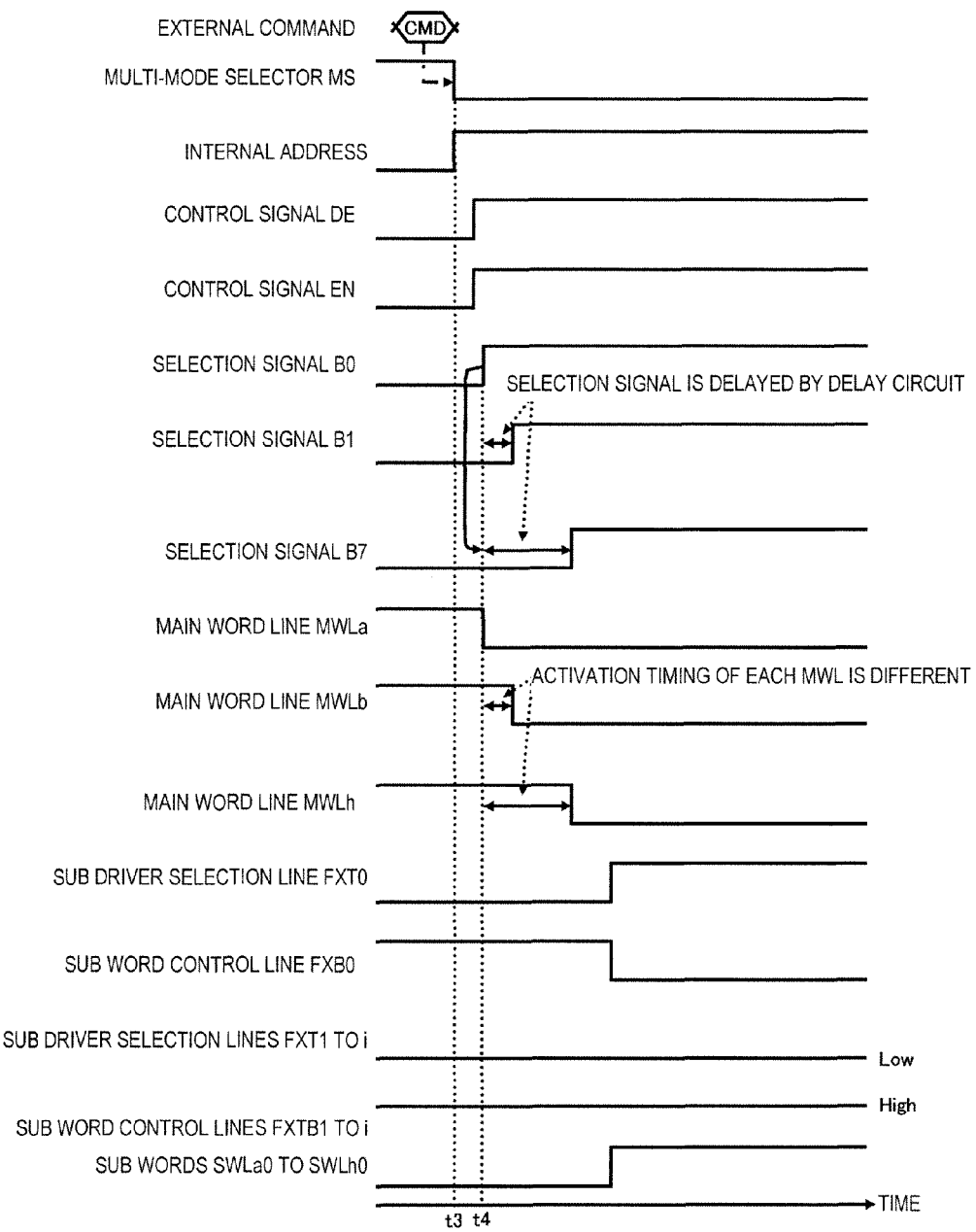
FIG. 15 is a timing chart showing a state of respective signals when in a multi-mode.

Next, a description is given concerning operation in a multi-mode. FIG. 15 is a timing chart showing a state of respective signals when in the multi-mode. As shown in FIG. 15, when a test command (external command) to transition the semiconductor memory device 1 to the multi-mode is issued, a multi-mode selector signal MS is activated (L level) (time t3). In accordance with the activation of the multi-mode selector signal MS, the selection signals B0 to B7 are all selected (H level). Although all of the selection signals B0 to B7 are selected, since the selection signals B0 to B7 are outputted via the delay circuits 304a to 304g, the timing at which they are respectively activated is different. Therefore, the activation timing of the main word lines MWLa to MWLh corresponding to the respective selection signals is also different. It is to be noted that although not shown in FIG. 15, the selection signals B2 to B6 and the main word lines MWLc to MWLg are activated at different timing, in the same way as other selection signals and main word lines.

Meanwhile, since the sub word lines SWLa0 to SWLh0 connected to the respective main word lines are activated in accordance with activation of the sub word driver selection line EXT and the sub word control line FXB, it is possible to have the activation timing of the sub word lines the same. In a test in the multi-mode, test data is written to respective memory cells connected to the sub word lines while the sub word lines are activated.

As described above, in the semiconductor memory device provided with a plurality of main word lines, the respective main word lines are activated at different timing in accordance with reception of a test command. As a result, there is no necessity for the main word drivers corresponding to the respective main word lines to operate simultaneously, and it is possible to normally activate the respective main word lines even when using drivers that do not have the power to drive the plural main word lines. Since there is no need to increase the power of the drivers, the overall power consumption of the semiconductor memory device does not increase, and furthermore, the semiconductor memory device does not malfunction due to a lack of power in the drivers.

It should be noted that other objects, features and aspects of the present invention will become apparent in the entire disclosure and that modifications may be done without departing the gist and scope of the present invention as disclosed herein and claimed as appended herewith. Also it should be noted that any combination or selection of the disclosed and/or claimed elements, matters and/or items may fall under the modifications aforementioned.

What is claimed is:

1. A semiconductor device comprising:
   first and second main word lines;
   a control circuit which, in response to a command signal received from outside of the semiconductor device, activates said first main word line at a first timing, and activates said second main word line at a second timing different from said first timing, said first main word line maintaining an activation state at said second timing; and
   a first main word line driver that is connected to said first main word line, and a second main word line driver that is connected to said second main word line, wherein
   the control circuit outputs first and second selection signals to said first and second main word line drivers in response to the command signal, respectively, said second selection signal being outputted after said first selection signal is outputted, and said first and second main word line drivers respectively activating said first and second main word lines in response to said first and second selection signals.

2. A semiconductor device comprising:
   first and second main word lines; and
   a control circuit which, in response to a command signal received from outside of the semiconductor device, activates said first main word line at a first timing, and activates said second main word line at a second timing different from said first timing, said first main word line maintaining an activation state at said second timing,
   wherein said control circuit, in a case of receiving an additional command signal received from outside of the semiconductor device, activates either one of said first and said second main word lines, and wherein said command signal is a test command signal, and said additional command signal is an active command signal.

3. The semiconductor device according to claim 2, further comprising:

first and second sub word lines provided correspondingly to said first and second main word lines, respectively; and a sub word driver that substantially simultaneously activates said first and second sub word lines after said second timing.

4. The semiconductor device according to claim 1, wherein said control circuit further outputs first and second control signals that controls activation and inactivation of said first and second main word line drivers, to said first and said second main word line drivers commonly.

5. The semiconductor device according to claim 4, wherein said control circuit comprises:

an operation mode control circuit that outputs said first control signal and said second control signal from an internal command in response to a command issued from the outside;

an address decoder that outputs said first selection signal and said second selection signal in accordance with an internal address signal in response to an address signal issued from the outside; and a multi-mode selector that outputs a mode selection signal to said address decoder in response to the command signal, wherein said address decoder outputs both of said first and second selection signals in spite of said internal address signal when said address decoder received said mode selection signal.

6. The semiconductor device according to claim 5, wherein said control circuit further comprises a first delay circuit that delays said first selection signal, and a second delay circuit that delays said second selection signal.

7. The semiconductor device according to claim 6, wherein a delay amount of said first delay circuit and a delay amount of said second delay circuit are different from each other.

8. A semiconductor device comprising:

a plurality of memory cells;

a plurality of word lines provided correspondingly to the memory cells, respectively; and a control circuit receiving a set of address signals and a mode selection signal, the control circuit being configured to respond to the mode selection signal taking a first logic level to bring one of the word lines, that is selected by the set of address signals, from an inactive state to an active state while maintaining each of remaining ones of the word lines at the inactive state and configured to respond to the mode selection signal taking a second logic level to bring, irrespective of the set of address signals, respective ones of the word lines from the inactive state to the active state at respective timings that are different from each other.

9. The semiconductor device according to claim 8, further comprising a plurality of word line drivers provided correspondingly to the word lines, respectively, wherein the control circuit outputs a plurality of selection signals that are supplied to the word line drivers, respectively, each of the word line drivers activating a corresponding one of the word lines in response to a corresponding one of the selection signals taking an active level.

10. The semiconductor device according to claim 9, wherein the control circuit includes a plurality of delay circuits, and the selection signals being outputted through the delay circuits, respectively.

11. The semiconductor device according to claim 10, wherein the delay circuits have delay amounts, respectively, and the delay amounts of the delay circuits being different from one another.

12. The semiconductor device according to claim 8, wherein the mode selection signal takes the first logic level when the device receives an active command, and the second logic level when the device receives a test command.

13. The semiconductor device according to claim 12, wherein each of the word lines comprises a main word line and a plurality of sub word lines, each of the sub word lines being connected to associated one or ones of the memory cells, one of the sub word lines is activated in response to the main word line being activated.

14. The semiconductor device according to claim 12, wherein the control circuit comprises an address decoder supplied with the set of address signals and the mode selection signal and producing a plurality of decoded signals corresponding to the word lines, respectively, one of the decoded signals taking an active level in response to the set of address signals when the mode selection signal takes the first logic level, and the each of the decoded signals taking the active level irrespective of the set of address signals when the mode selection signal takes the second logic level.

* * * * *